(12) United States Patent
Chen et al.

(10) Patent No.: US 12,014,889 B2
(45) Date of Patent: Jun. 18, 2024

(54) MAGNETIC INDUCTION SWITCH

(71) Applicants: Self Electronics Co., Ltd., Zhejiang (CN); Wanjiong Lin, Zhejiang (CN); Self Electronics USA Corporation, Norcross, GA (US)

(72) Inventors: Dong Chen, Zhejiang (CN); Minghai Zhao, Zhejiang (CN); Binjie Xu, Zhejiang (CN); Jianguo Dong, Zhejiang (CN); Kai Xu, Zhejiang (CN)

(73) Assignee: Self Electronics Co., Ltd., Ningbo (CN)

( * ) Notice: Subject to any disclaimer, the term of this patent is extended or adjusted under 35 U.S.C. 154(b) by 623 days.

(21) Appl. No.: 17/302,665

(22) Filed: May 10, 2021

(65) Prior Publication Data
US 2021/0358705 A1 Nov. 18, 2021

(30) Foreign Application Priority Data
May 13, 2020 (CN) .......................... 202020796765.1

(51) Int. Cl.
*H01H 50/18* (2006.01)
*H01H 36/00* (2006.01)
*H01H 50/02* (2006.01)

(52) U.S. Cl.
CPC ............ *H01H 50/18* (2013.01); *H01H 36/00* (2013.01); *H01H 50/02* (2013.01)

(58) Field of Classification Search
CPC ............................ H01H 201/048; H01H 36/00
USPC .................................................. 335/205–207
See application file for complete search history.

(56) References Cited

U.S. PATENT DOCUMENTS

| | | | | |
|---|---|---|---|---|
| 5,430,264 A * | 7/1995 | Shinohara | ............ | H01H 21/285 335/207 |
| 6,300,852 B1 * | 10/2001 | Kato | ........................ | B60Q 1/40 200/61.54 |
| 6,534,971 B1 * | 3/2003 | Braun | .................... | G01D 5/145 324/207.2 |
| 6,759,933 B2 * | 7/2004 | Fallak | ...................... | G05G 9/00 335/207 |
| 7,352,174 B1 * | 4/2008 | Lee | .......................... | G01D 5/25 335/206 |
| 7,401,483 B2 * | 7/2008 | Dimig | ................... | F16D 27/025 335/289 |
| 7,714,242 B2 * | 5/2010 | Ishigaki | ................ | H01H 19/03 200/43.11 |
| 8,106,733 B2 * | 1/2012 | Nakasuji | ............ | H01H 36/0066 219/457.1 |

(Continued)

*Primary Examiner* — Alexander Talpalatski
(74) *Attorney, Agent, or Firm* — Wang Law Firm, Inc.

(57) ABSTRACT

A magnetic induction switch has a base; a mounting cavity is arranged in the base; an induction circuit board is arranged in the mounting cavity and a Hall induction element is provided; a rotating cover is rotated on the base and is provided with at least two positioning points on the rotating path; the magnet is provided in the rotating cover, and the position of the magnet relative to the Hall induction element changes during the rotation of the rotating cover so that the induction circuit board generates control signals; the magnetic induction switch of the invention is waterproof, avoids hidden trouble existing in the ignition of the mechanical switch, and has the advantages of simple structure and convenient manufacture.

5 Claims, 5 Drawing Sheets

(56) References Cited

U.S. PATENT DOCUMENTS

| | | | |
|---|---|---|---|
| 8,773,116 B2* | 7/2014 | Hirose | G01D 5/145 |
| | | | 324/207.2 |
| 2002/0057152 A1* | 5/2002 | Elferich | B60K 35/10 |
| | | | 335/220 |

* cited by examiner

MAGNETIC INDUCTION SWITCH

RELATED APPLICATION

This application claims priority to a Chinese Patent Application No. CN 202020796765.1, filed on May 13, 2020.

FIELD OF THE TECHNOLOGY

The invention relates to regulating switches, particularly a magnetic induction switch.

BACKGROUND OF THE INVENTION

Under the background of energy saving and environmental protection, LED lamps are increasingly used in home and commercial lighting because of their high light emission efficiency and good light gathering performance. In order to improve the diversity of commercial lighting, more and more LED lamps have the function of multi-color adjustable.

When such LED lamps are used in a closed freezer, propane gases will occur in the freezer. In order to prevent propane gas explosion, it cannot use mechanical switches in the freezer according to the provisions on propane gas in 2018 since the mechanical switches may strike sparks, at the same time, it also needs a good waterproof effect in the freezer. In order to solve the above problems, it is necessary to develop a targeted control switch.

BRIEF SUMMARY OF THE INVENTION

In view of this, the invention provides a magnetic induction switch to solve the above technical problems.

A magnetic induction switch, comprising:
base;
mounting chamber, arranged in the base;
induction circuit board arranged in the mounting chamber and provided with a Hall induction element;
rotating cover rotated and arranged on the base and provided with at least two positioning points on the rotation path;
magnet, arranged in the rotating cover, and the magnet changes its position relative to the Hall induction element during rotation of the rotating cover to make the induction circuit board generate a control signal.

advantageously, the base comprises a boss with a mounting chamber at the bottom and a bottom cover that seals the mounting chamber.

advantageously, the bottom cover is provided with an external wire, one end of the external wire is extended into the mounting chamber and connected with the induction circuit board, and the other end is provided with a connector.

advantageously, the boss is provided with a snap ring, and the rotating cover is provided with a clamping connector that cooperates with the snap ring.

advantageously, a dial block protruding radially inward is arranged inside the rotating cover, and the top surface of the boss is provided with a first baffle and a second baffle along the rotation path interval arranged on both sides of the dial block, and there is a stop-back convex block provided between the first baffle and the second baffle that is opposed to the dial block, and the dial block and the middle of the stop-back convex block is abut and matched.

advantageously, the dial block is V-shaped, and the tip is abut and matched with the stop-back convex block.

advantageously, the stop-back convex block is a matching surface of circular arc type.

The technical effect of the invention:
The magnetic induction switch of the invention has a good waterproof effect, avoids the hidden trouble existing in the ignition of the mechanical switch, and its structure is simple and easy to manufacture.

BRIEF DESCRIPTION OF THE DRAWINGS

Embodiments of the present invention are described below with reference to the drawings, in which.

DETAILED DESCRIPTION OF THE INVENTION

Hereinafter, specific embodiments of the present invention will be described in further detail based on the drawings. It should be understood that the description of the embodiments of the present invention is not intended to limit the protection scope of the present invention.

Figure 1:
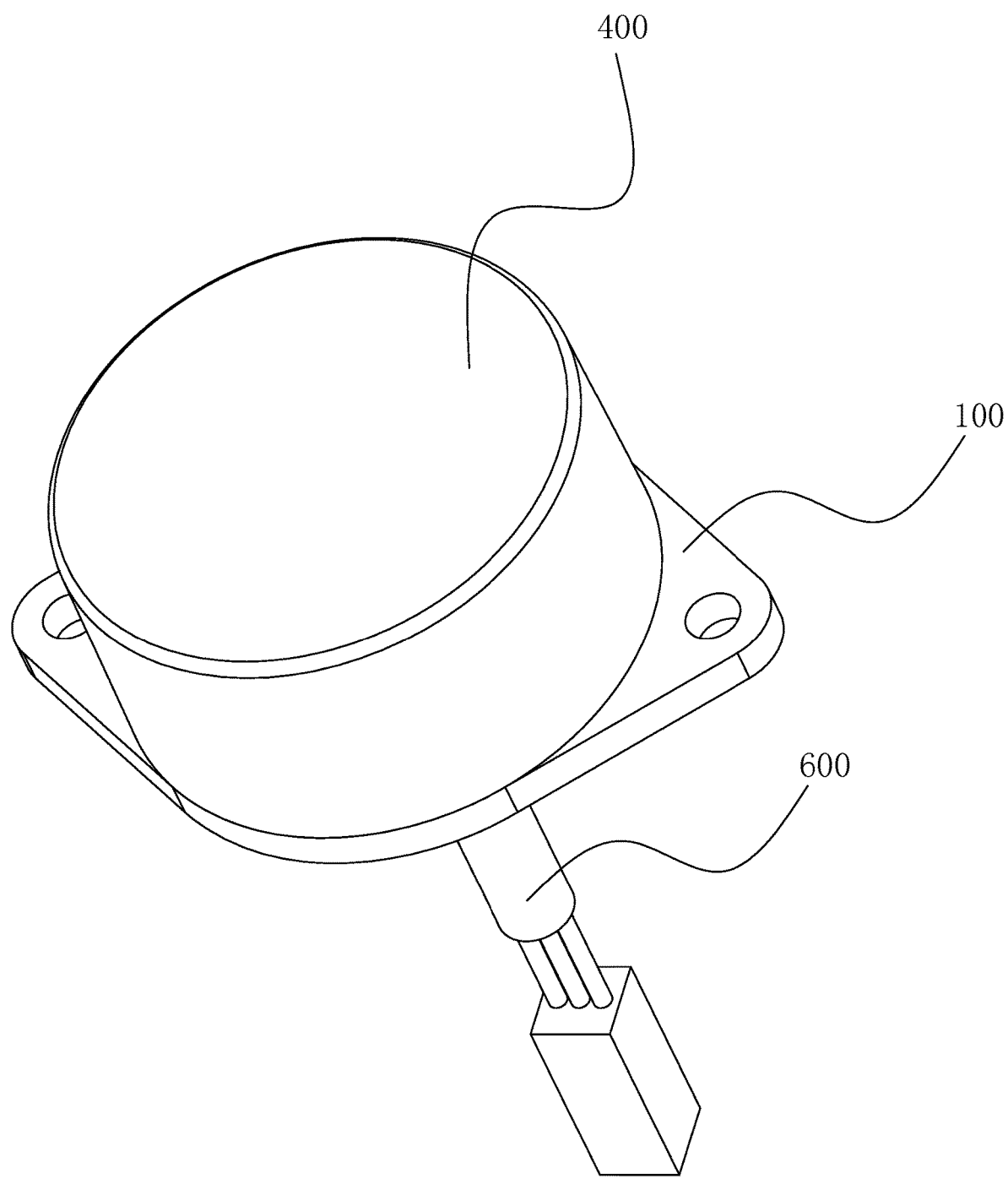
FIG. 1 is a structural schematic diagram of the magnetic induction switch in this embodiment.
Figure 2:
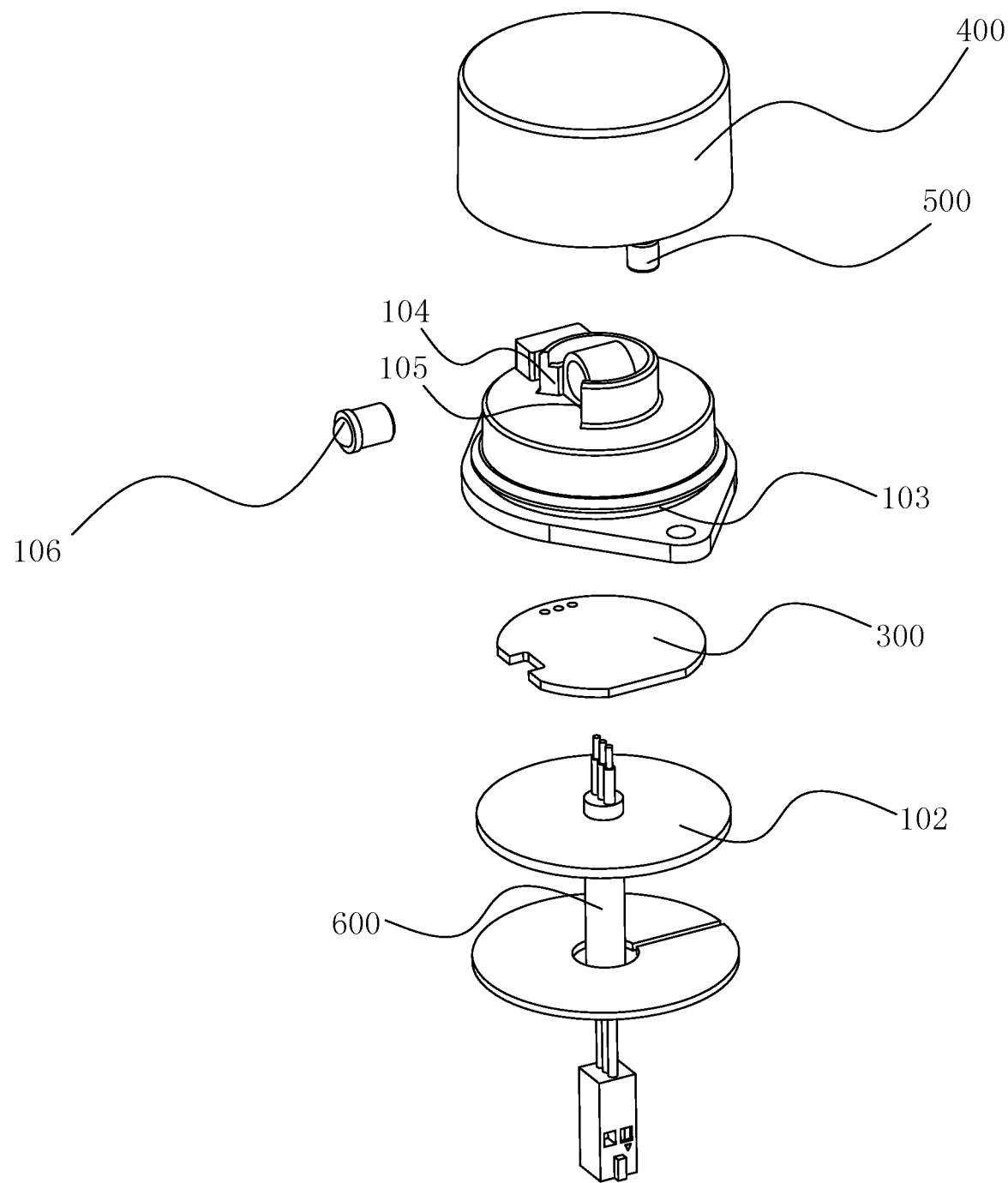
FIG. 2 is a schematic diagram of the explosion structure of the magnetic induction switch in this embodiment.
Figure 3:
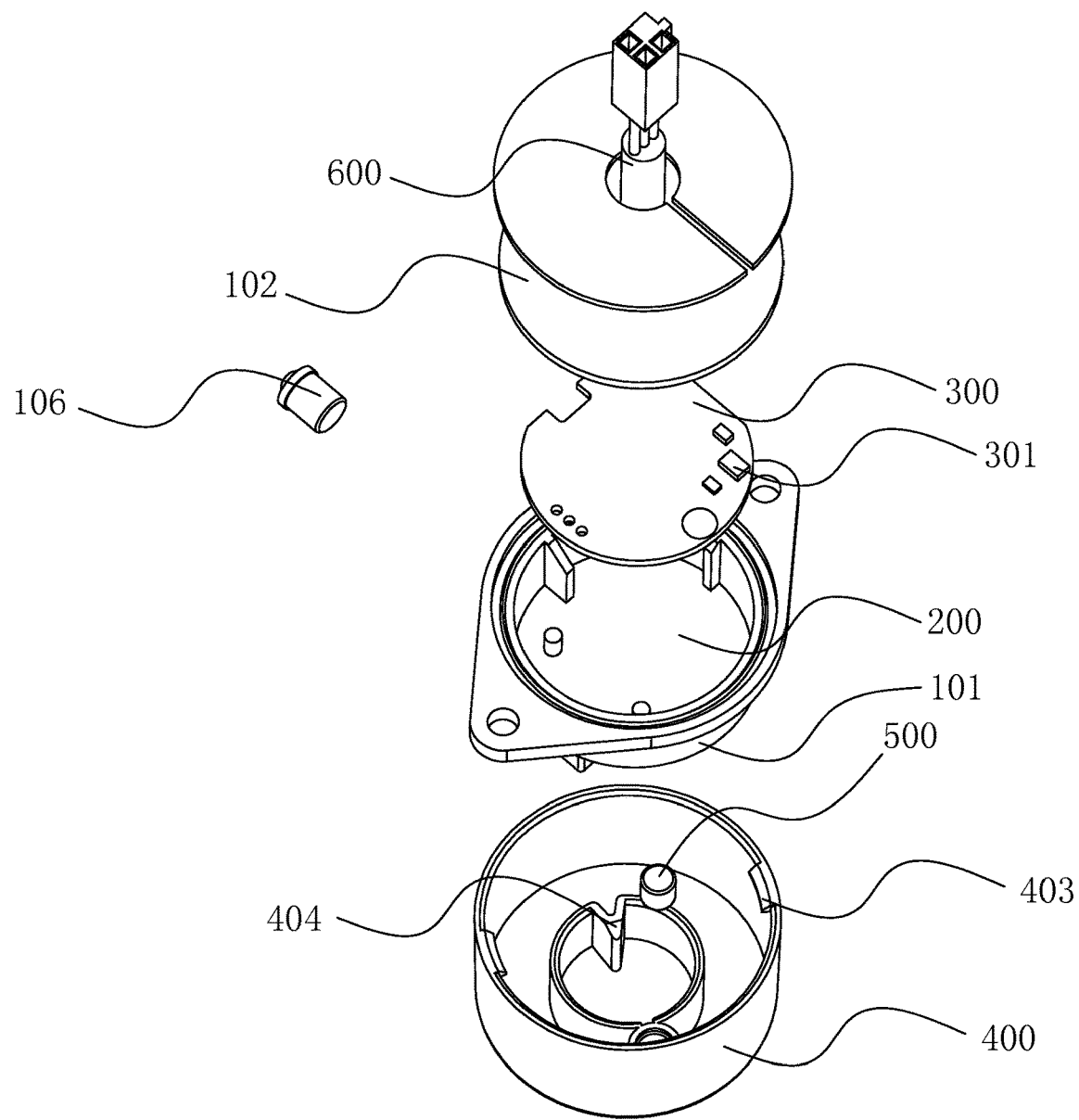
FIG. 3 is a schematic diagram of the explosion structure of the magnetic induction switch in this embodiment from another perspective.
Figure 4:
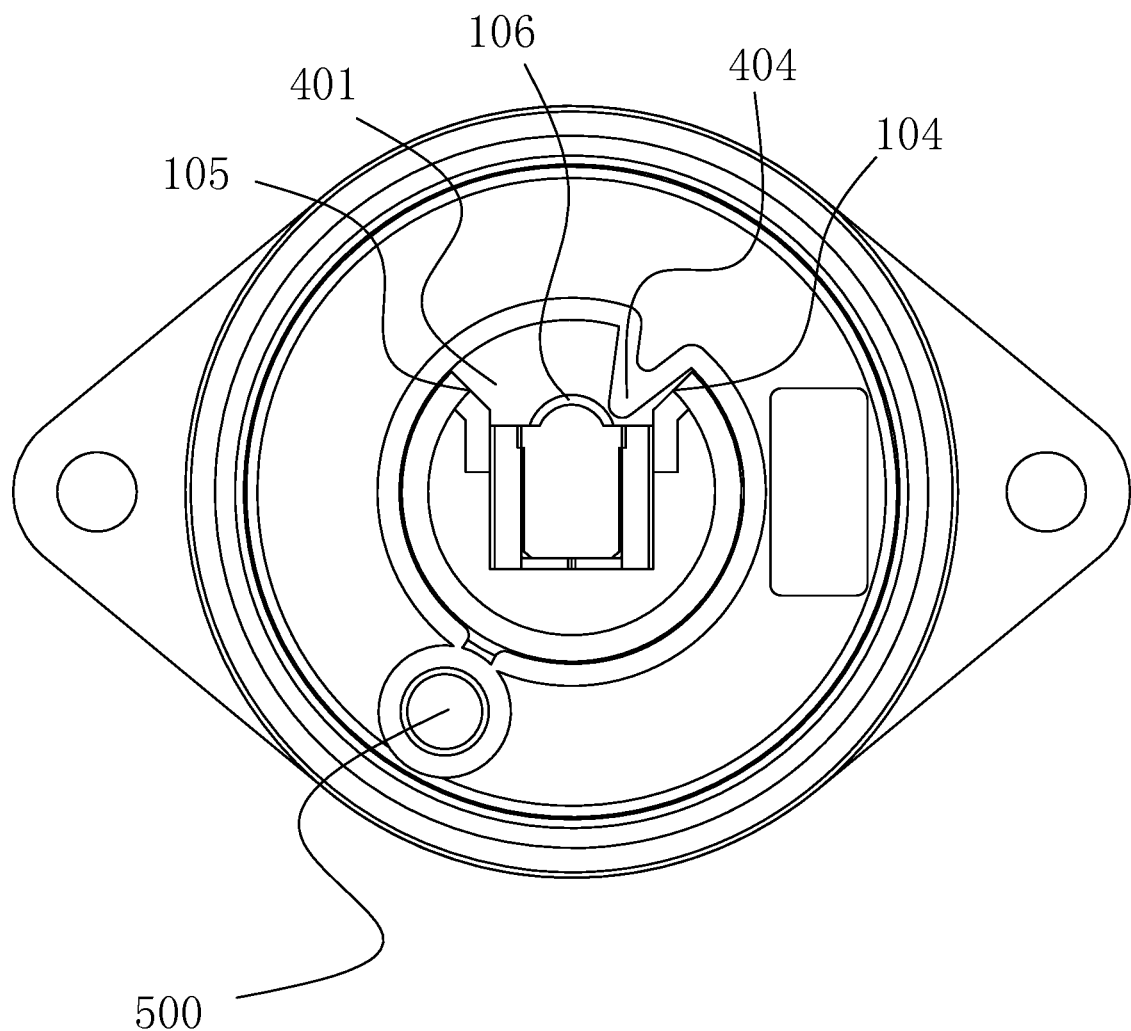
FIG. 4 is the schematic diagram of the internal structure of the magnetic induction switch in this embodiment at anchor point 401.
Figure 5:
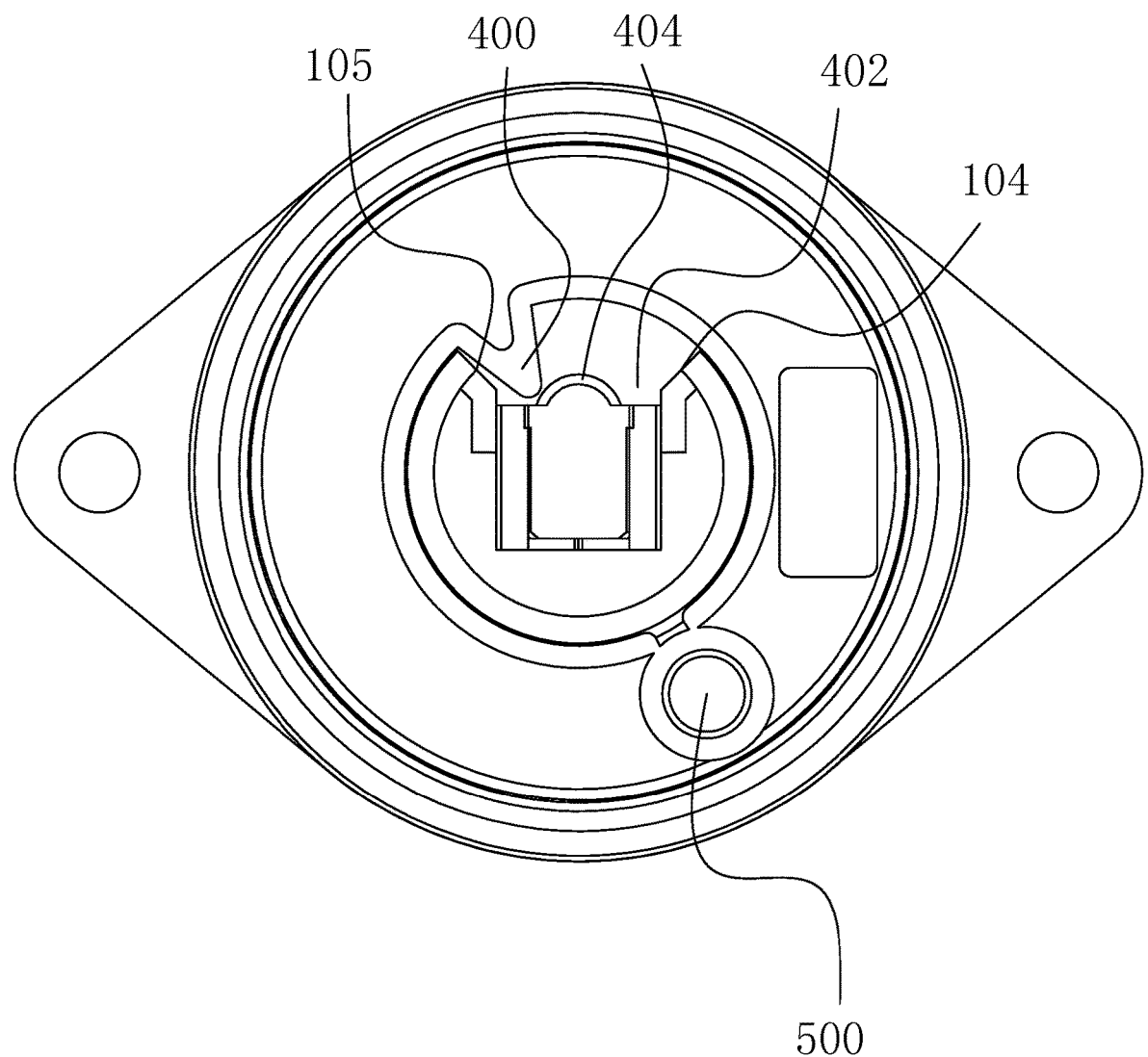
FIG. 5 is the schematic diagram of the internal structure of the magnetic induction switch in this embodiment at registration point 402.

As shown in FIGS. 1~5, the magnetic induction switch of the present embodiment includes a base 100, a mounting chamber 200, an induction circuit board 300, a rotating cover 400, and a magnet 500. The mounting chamber 200 is arranged in the base 100; the induction circuit board 300 is arranged in the mounting chamber 200, which is provided with a Hall induction element 301.

The Hall induction element 301 can sense the movement of the magnet 500 to generate a signal. The magnet 500 is arranged in the rotating cover 400. During the rotation of the rotating cover 400, the magnet 500 changes its position relative to the Hall induction element 301 to make the induction circuit board 300 generate a control signal.

The rotating cover 400 is rotated and arranged on the base 100 and first positioning points 401 and second positioning point 402 are provided on the rotation path. Two positioning points generate two control signals, and if multiple control signals are required, the number of Hall induction elements 301 and the number of positioning points can be appropriately increased.

The base 100 is fixedly arranged and generally equipped with structure for fixing, in this embodiment, the base 100 includes a boss 101 having a mounting chamber 200 at the bottom and a bottom cover 102 that seals the mounting chamber 200. In order to improve the sealing effect, the bottom cover 102 adopts ultrasonic pressure welding seal to realize installation.

In order to facilitate the connection of equipment, such as the control and connection of dual-color temperature LED lamps, in the present embodiment, the bottom cover 102 is provided with an external wire 600, and one end of the external wire 600 is extended into the mounting chamber 200 and connected with the induction circuit board 300, and the other end is provided with a connector. The external wire 600 and the bottom cover 102 are fixed together.

In order to facilitate manufacturing and installation, in the present embodiment, the boss 101 is provided with a snap ring 103, and the rotating cover 400 is provided with a clamping connector 403 that cooperates with the snap ring 103. The clamping connector 403 is a clamping buckle arranged on the inner wall of the rotating cover 400, and there are two relative settings in this embodiment.

In order to achieve positioning at the first positioning point 401 and the second positioning point 402, the specific structure can be designed as needed, in this embodiment, in order to accurately control, a dial block 404 protruding radially inward is arranged inside the rotating cover 400. The top surface of the boss 101 is provided with a first baffle 104 and a second baffle 105 along the rotation path interval arranged on both sides of the dial block 404, and there is a stop-back convex block 106 provided between the first baffle 104 and the second baffle 105 that is opposed to the dial block 404. The dial block 404 and the middle of the stop-back convex block 106 is abutted and matched. On both sides of the stop-back convex block 106 are first positioning points 401 and second positioning point 402, respectively. After the dial block 404 crosses the middle of the stop-back convex block 106, the rotating cover 400 switches between the first positioning point 401 and the second positioning point 402.

Specifically, the dial block 404 is a V-shaped, and the tip is abut and matched with the stop-back convex block 106, and the stop-back convex block 106 is a matching surface of circular arc type. The above structure can make the rotation more smoothly and the positioning is stable.

The above disclosure has been described by way of example and in terms of exemplary embodiment, and it is to be understood that the disclosure is not limited thereto. Rather, any modifications, equivalent alternatives or improvement etc. within the spirit of the invention are encompassed within the scope of the invention as set forth in the appended claims.

What is claimed is:

1. A magnetic induction switch, comprising:
   a base (100) with a boss (101);
   a mounting chamber (200), arranged at a bottom of the base (100) and having a bottom cover (102) sealing the mounting chamber (200);
   an induction circuit board (300), arranged in the mounting chamber (200) and provided with a Hall induction element (301);
   a rotating cover (400), rotated and arranged on the base (100) and provided with at least two positioning points (401, 402) on a rotation path;
   a magnet (500), arranged in the rotating cover (400), and the magnet (500) changes its position relative to the Hall induction element (301) during rotation of the rotating cover (400) to make the induction circuit board (300) generate a control signal,
   wherein the boss (101) is provided with a snap ring (103), and the rotating cover (400) is provided with a clamping connector (403) that cooperates with the snap ring (103).

2. The magnetic induction switch as claimed in claim 1, wherein the bottom cover (102) is provided with an external wire (600), one end of the external wire (600) is extended into the mounting chamber (200) and connected with the induction circuit board (300), and the other end is provided with a connector.

3. The magnetic induction switch as claimed in claim 1, wherein a dial block (404) protruding radially inward is arranged inside the rotating cover (400), and the top surface of the boss (101) is provided with a first baffle (104) and a second baffle (105) along the rotation path interval arranged on both sides of the dial block (404), and there is a stop-back convex block (106) provided between the first baffle (104) and the second baffle (105) that is opposed to the dial block (404), and the dial block (404) and the middle of the stop-back convex block (106) is abut and matched.

4. The magnetic induction switch as claimed in claim 3, wherein the dial block (404) is V-shaped, the tip is abut and matched with the stop-back convex block (106).

5. The magnetic induction switch as claimed in claim 3, wherein the stop-back convex block (106) is a matching surface of circular arc type.

\* \* \* \* \*